United States Patent
Um et al.

(10) Patent No.: US 8,624,230 B2
(45) Date of Patent: Jan. 7, 2014

(54) ORGANIC LIGHT EMITTING DIODE DISPLAY

(75) Inventors: Sa-Bang Um, Yongin-si (KR);
Soon-Ryong Park, Yongin-si (KR);
Jae-Yong Kim, Yongin-si (KR);
Woo-Suk Jung, Yongin-si (KR);
Duk-Jin Lee, Yongin-si (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 38 days.

(21) Appl. No.: 12/916,133

(22) Filed: Oct. 29, 2010

(65) Prior Publication Data

US 2011/0127570 A1 Jun. 2, 2011

(30) Foreign Application Priority Data

Dec. 2, 2009 (KR) ........................ 10-2009-0118748

(51) Int. Cl.
H01L 29/08 (2006.01)
H01L 35/24 (2006.01)
H01L 51/00 (2006.01)

(52) U.S. Cl.
USPC .................................. 257/40; 257/E51.022

(58) Field of Classification Search
USPC ............................ 257/40, E51.022
See application file for complete search history.

(56) References Cited

U.S. PATENT DOCUMENTS

| | | | | |
|---|---|---|---|---|
| 6,853,013 | B2* | 2/2005 | Hirai et al. ............... | 257/103 |
| 7,303,788 | B2* | 12/2007 | Kataoka et al. ........... | 427/553 |
| 8,178,214 | B2* | 5/2012 | Oshiyama et al. ........ | 428/690 |
| 2008/0297042 | A1* | 12/2008 | Ahn et al. ................. | 313/504 |
| 2009/0179550 | A1* | 7/2009 | Koo et al. ................. | 313/504 |
| 2010/0078665 | A1* | 4/2010 | Koyama .................... | 257/98 |
| 2011/0101508 | A1* | 5/2011 | Kozawa et al. ........... | 257/632 |
| 2011/0111951 | A1* | 5/2011 | Joslin et al. .............. | 502/159 |
| 2011/0112120 | A9* | 5/2011 | Kuroita et al. ............ | 514/269 |
| 2013/0066029 | A1* | 3/2013 | Radlauer et al. .......... | 526/171 |
| 2013/0084438 | A1* | 4/2013 | Iwato et al. ............... | 428/195.1 |

FOREIGN PATENT DOCUMENTS

| | | |
|---|---|---|
| JP | 2000-068050 | 3/2000 |
| JP | 2001-176653 | 6/2001 |
| JP | 2003-197366 | 7/2003 |
| KR | 10-2001-0050684 | 6/2001 |
| KR | 10-2004-0078508 | 9/2004 |
| KR | 10-2005-0120354 | 12/2005 |
| KR | 1020060084743 A | 7/2006 |
| KR | 1020080021650 A | 3/2008 |
| KR | 10-2008-0107220 | 12/2008 |
| KR | 10-2009-0021790 | 3/2009 |

OTHER PUBLICATIONS

Farlex, "Cyclic compound", "TheFreeDictionary", p. 1.*

* cited by examiner

*Primary Examiner* — Phat X Cao
(74) *Attorney, Agent, or Firm* — Robert E. Bushnell, Esq.

(57) ABSTRACT

Disclosed is an organic light emitting diode (OLED) device, which includes: an organic light emitting diode including a first electrode, a second electrode, and an emission layer interposed between the first electrode and the second electrode; a base substrate supporting the organic light emitting diode; and a sealing member disposed on the base substrate while covering the organic light emitting diode. Herein, the sealing member includes a fluorinated epoxy sealing material including a fluorinated epoxy resin.

4 Claims, 3 Drawing Sheets

ORGANIC LIGHT EMITTING DIODE DISPLAY

CLAIM OF PRIORITY

This application claims priority to and the benefit of Korean Patent Application No. 10-2009-0118748 filed in the Korean Intellectual Property Office on Dec. 2, 2009, the entire contents of which are incorporated herein by reference.

BACKGROUND OF THE INVENTION

1. Field of the Invention

The described technology relates generally to an organic light emitting diode (OLED) device.

2. Summary of the Invention

One embodiment of this disclosure provides an organic light emitting diode (OLED) device with improved life-span by providing excellent water-proofing ability in a high-temperature and high-humidity environment, and thus minimizes contamination.

According to one aspect of this disclosure, an organic light emitting diode device is provided that includes an organic light emitting diode including a first electrode, a second electrode, and an emission layer interposed between the first electrode and the second electrode; a base substrate supporting the organic light emitting diode; and a sealing member disposed on the base substrate while covering the organic light emitting diode. The sealing member includes a fluorinated epoxy sealing material including a fluorinated epoxy resin.

The fluorinated epoxy resin may include a fluorinated resin of an epoxy resin selected from the group consisting of an aromatic epoxy resin, an alicyclic epoxy resin, and combinations thereof.

The fluorinated epoxy sealing material may further include a copolymer of the fluorinated epoxy resin and a resin selected from the group consisting of a (meth)acryl-based resin, polyisoprene, a vinyl-based resin, a urethane-based resin, a cellulose-based resin, a perylene-based resin, and combinations thereof.

The sealing member may further include a first primer layer interposed between the fluorinated epoxy sealing material and the base substrate.

The sealing member may be formed through a thin film-type encapsulation, method in which the front surface of the organic light emitting diode is coated with the fluorinated epoxy sealing material. The sealing member may further include an inorganic layer formed on top of the fluorinated epoxy sealing material.

The inorganic layer may include an inorganic material of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or combinations thereof.

Also, the sealing member may be formed through a can-type encapsulation method in which the upper surface of the base substrate on the external side of the organic light emitting diode is coated with the fluorinated epoxy sealing material. The sealing member may further include an encapsulation substrate which faces the base substrate and covers the front surface of the organic light emitting diode.

The encapsulation substrate may be glass, a polymer thin film, or metal.

The sealing member may further include a second primer layer interposed between the fluorinated epoxy sealing material and the encapsulation substrate.

The organic light emitting diode device according to one embodiment may have an improved life-span by having excellent water-proofing ability in a high-temperature and high-humidity environment and thus minimizes contamination, and it may be applied not only to a small display device but also a large-area display device as well.

DESCRIPTION OF REFERENCE NUMERALS INDICATING PRIMARY ELEMENTS IN THE DRAWINGS

Figure 1:
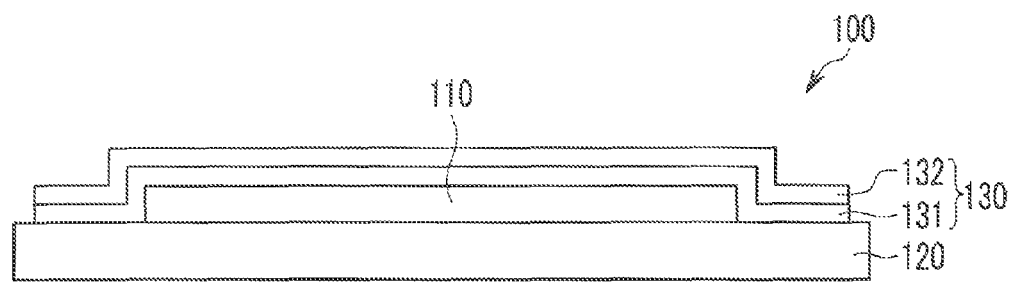
FIG. 1 is a schematic view of a thin film-encapsulated organic light emitting diode (OLED) device according to one embodiment.

100: thin film-encapsulated organic light emitting diode device
200: can-encapsulated organic light emitting diode device
110, 210: organic light emitting diode 120, 220: base substrate
130, 230: sealing member 131, 232: flourinated epoxy sealing material
132: inorganic layer 232: encapsulation substrate

DETAILED DESCRIPTION

An organic light emitting diode (OLED) device, which is a type of flat panel display device, is encapsulated through a can-type encapsulation method using metal or glass or a thin film-type encapsulation method using an inorganic material or an organic material.

The can-type encapsulation method using metal or glass includes preparing a base substrate with an organic light emitting diode formed therein and an encapsulation substrate formed on top of the organic light emitting diode to protect the organic light emitting diode from being degraded, coating any one of the base substrate and the encapsulation substrate with a sealing material, laminating the base substrate and the encapsulation substrate with each other, and curing them through heat or light to adhesively fix them onto each other. The sealing material includes an epoxy resin, and the inside of the can produced by laminating the base substrate with the encapsulation substrate is filled with nitrogen. To remove moisture, a moisture absorbent such as $P_2O_2$, BaO, and CaO may be provided to the inside of the can.

The can-type encapsulation method has excellent barrier characteristics and is advantageous in terms of life-span of the organic light emitting diode device. However, due to difficulties in the manufacturing process, there are drawbacks such as high cost, penetration of moisture and oxygen through the sealing material, difficulty in applying the technology to a flexible display device, and difficulty in manufacturing a large-area organic light emitting diode device.

According to the thin film-type encapsulation method using an inorganic material or an organic material, a sealing material including an epoxy resin is formed to tightly adhere onto the base substrate and the organic light emitting diode. The thin film-type encapsulation method solves most of the problems of the can-type encapsulation method. In short, since the process is simple, it is low cost and it may be applied to a flexible display device and a large-area organic light emitting diode device.

However, the thin film-type encapsulation method still fails to solve the problem of moisture and oxygen penetration through the sealing material.

This disclosure will be described more fully hereinafter with reference to the accompanying drawings, in which exemplary embodiments are shown. This disclosure may, however, be embodied in many different forms and is not to be construed as limited to the exemplary embodiments set forth herein.

In the drawings, the thickness of layers, films, panels, regions, etc., are to exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The organic light emitting diode (OLED) device according to one embodiment includes an organic light emitting diode including a first electrode, a second electrode, and an emission layer interposed between the first electrode and the second electrode; a base substrate supporting the organic light emitting diode; and a sealing member disposed on the base substrate while covering the organic light emitting diode. The sealing member includes a fluorinated epoxy sealing material including a fluorinated epoxy resin.

The fluorinated epoxy resin is obtained by substituting hydrogen of an epoxy resin with fluorine. The fluorinated epoxy resin has enhanced hydrophobic properties, compared with general epoxy resins.

The fluorinated epoxy resin may include a fluorinated resin of an epoxy resin selected from the group consisting of an aromatic epoxy resin, an alicyclic epoxy resin, and combinations thereof.

The fluorinated epoxy sealing material may further include a copolymer of a fluorinated epoxy resin and a resin selected from the group consisting of a (meth)acryl-based resin, polyisoprene, a vinyl-based resin, a urethane-based resin, a cellulose-based resin, a perylene-based resin, and combinations thereof.

The sealing member according to one embodiment of this disclosure may be formed through a can-type encapsulation method or a thin film-type encapsulation method.

Hereafter, referring to FIGS. 1 and 2, the encapsulation method of the organic light emitting diode device manufactured according to one embodiment of this disclosure will be described.

FIG. 1 is a schematic view of a thin film-encapsulated organic light is emitting diode device according to one embodiment.

As shown in FIG. 1, the thin film-encapsulated organic light emitting diode device 100 includes an organic light emitting diode 110, a base substrate 120 and a sealing member 130.

The organic light emitting diode 110 includes a pair of electrodes facing each other and an emission layer interposed between the pair of electrodes.

One of the pair of electrodes may be an anode and the other may be a cathode. The anode is an electrode into which holes are injected. The anode has a high work function and it may be formed of a transparent conductive material through which emitted light may be transmitted to the exterior. Non-limiting examples of the material for the anode include ITO or IZO. A cathode is an electron into which electrons are injected. The cathode has a low work function and it may be formed of a conductive material that does not affect an organic material. Non-limiting examples of the material for the cathode include aluminum (Al), calcium (Ca) and barium (Ba).

The emission layer includes an organic material that may emit light when voltage is applied to the pair of electrodes.

An additional layer may be positioned between one electrode and the emission layer and between the other electrode and the emission layer. The additional layer may include a hole transporting layer for balancing electrons and holes, and a hole injecting layer, an electron injecting layer, and an electron transporting layer.

The base substrate 120 is disposed in the lower portion of the organic light emitting diode 110 to support the organic light emitting diode 110. The base substrate 120 may be formed of glass, silicon wafer, polymer, or the like.

The sealing member 130 may be formed to adhesively cover and protect the front surface of the organic light emitting diode 110 formed on the base substrate 120.

The sealing member 130 used for the thin film-encapsulated organic light emitting diode device 100 includes a fluorinated epoxy sealing material 131 and an inorganic layer 132 formed on the fluorinated epoxy sealing material 131. If necessary, it may further include a first primer layer (not shown) interposed between the fluorinated epoxy sealing material 131 and the base substrate 120.

The inorganic layer 132 may include an inorganic material selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), and combinations thereof.

The first primer layer is interposed between the fluorinated epoxy sealing material 131 and the base substrate 120 to improve adherence between the fluorinated epoxy sealing material 131 and the base substrate 120.

Figure 2:
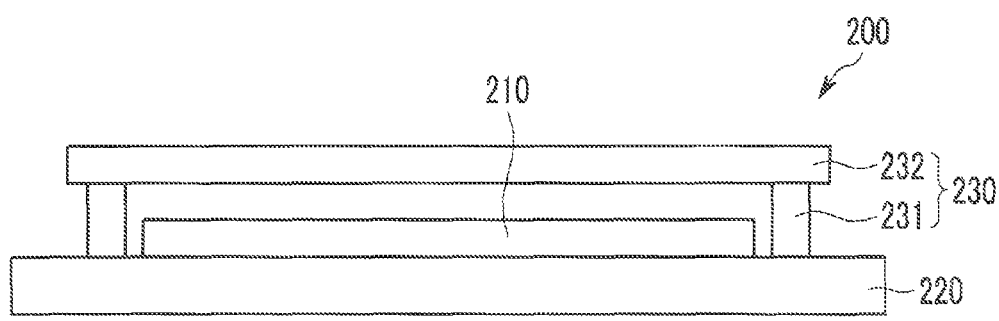
FIG. 2 is a schematic view showing an organic light emitting diode device manufactured through a can-type encapsulation method in accordance with one to embodiment.

FIG. 2 illustrates a can-encapsulated organic light emitting diode device according to one embodiment.

As shown in FIG. 2, the can-encapsulated organic light emitting diode device 200 manufactured according to one embodiment includes an organic light emitting diode 210, a base substrate 220, and a sealing member 230.

The organic light emitting diode 210 and the base substrate 220 may be the same as the thin film-encapsulated organic light emitting diode device 100.

The sealing member 230 may be adhesively formed to cover and protect the front surface of the organic light emitting diode 210 formed on the base substrate 220.

The sealing member 230 used in the can-encapsulated organic light emitting diode 200 may further include a first primer layer (not shown) which faces a fluorinated epoxy sealing material 231 coating the upper surface of an external base substrate of the organic light emitting diode and also faces the base substrate 220, and if necessary, is interposed between the fluorinated epoxy sealing material 231 and the base substrate 220; or a second primer layer (not shown) which is interposed between the fluorinated epoxy sealing material 231 and the encapsulation substrate 232.

The encapsulation substrate 232 hermetically seals the organic light emitting diode 210, and it may be formed of a material such as glass, a polymer thin film, or metal, to cut off moisture and oxygen flowing in from the exterior.

Also, the sealing member 230 may further include an inorganic or organic filler (not shown) filling a region between the base substrate 220 and the encapsulation substrate 232.

The following examples illustrate this disclosure in more detail. These examples, however, are not in any sense to be interpreted as limiting the scope of this disclosure.

EXAMPLE 1

A glass substrate is coated with a fluorinated epoxy sealing material in a thickness of about 4 μm to thereby prepare a specimen.

COMPARATIVE EXAMPLE 1

A specimen is prepared according to the same method as Example 1, except that a general epoxy sealing composition is used instead of a fluorinated epoxy sealing material.

<Assessment of Physical Properties: Measurement of High-temperature and High-humidity Reliability>

Specimens prepared according to Example 1 and Comparative Example 2 are allowed to stand at a temperature of about 80° C. in a humidity of about 95% for about 120 hours, and then their appearances are observed. The results are as shown in FIGS. 3 and 4.

Figure 3:
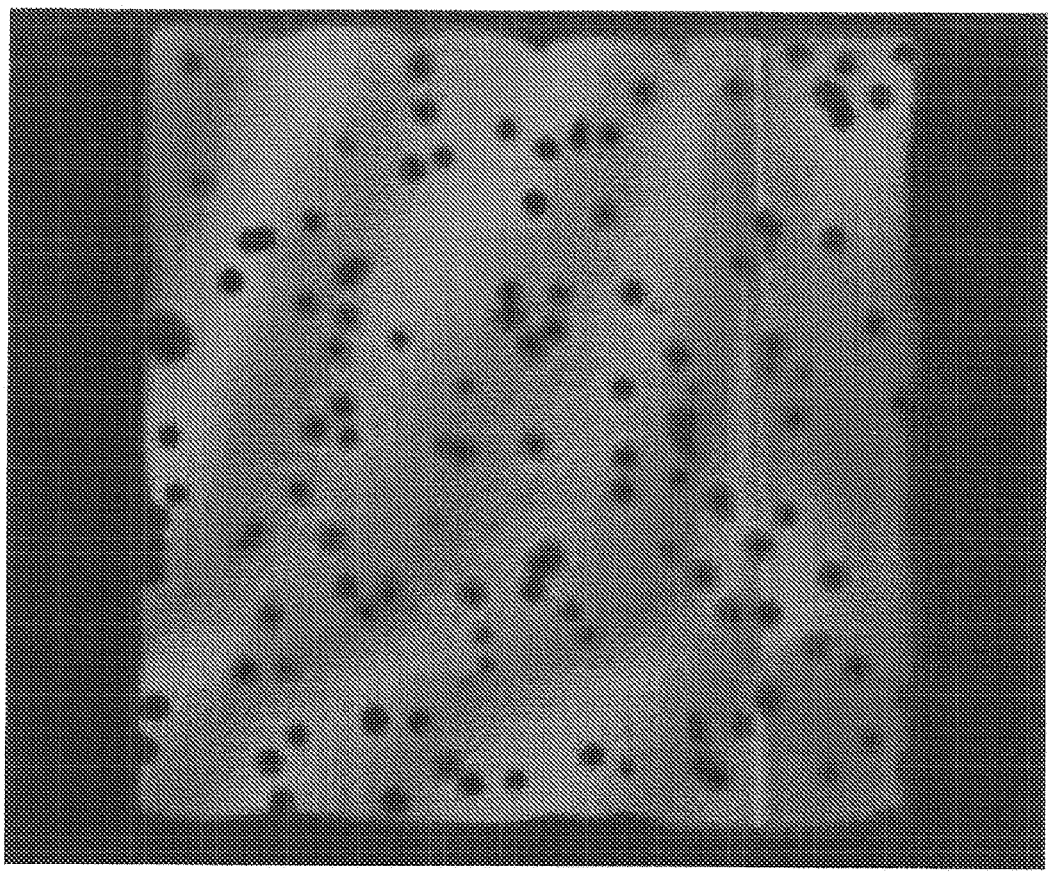
FIG. 3 shows a specimen prepared according to Example 1 for assessing reliability in a high-temperature and high-humidity environment
Figure 4:
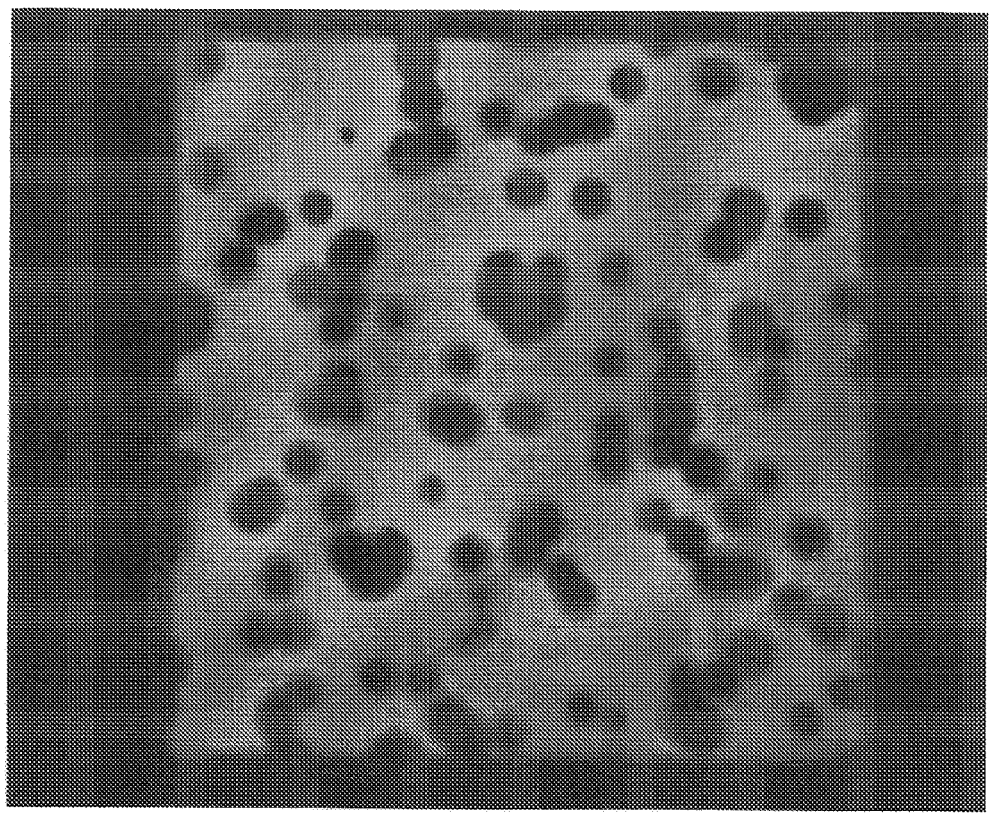
FIG. 4 is a specimen prepared according to Comparative Example 2 for assessing reliability in a high-temperature and high-humidity environment.

FIG. 3 is a specimen prepared according to Example 1 for assessing reliability in a high-temperature and high-humidity environment, and FIG. 4 is a specimen prepared according to Comparative Example 2 for assessing reliability in a high-temperature and high-humidity environment. Referring to FIGS. 3 and 4, specimens using unfluorinated epoxy resin have a large block spot with a wide area, which indicates that organic electro-luminescence (EL) is changed. On the other hand, specimens using fluorinated epoxy resin have a small block spot with a narrow area, which indicates that the specimens using fluorinated epoxy resin have excellent waterproofing ability. Therefore, it is expected that when a sealing material for an organic light emitting display element including fluorinated epoxy resin, the reliability in a high-temperature and high-humidity environment becomes excellent and the contamination of the organic light emitting diode is minimized to thereby improve the life-span of the organic light emitting diode (OLED) device.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) device, comprising:
    an organic light emitting diode including a first electrode, a second electrode, and an emission layer interposed between the first electrode and the second electrode;
    a base substrate supporting the organic light emitting diode; and
    a sealing member disposed on the base substrate while covering the organic light emitting diode, wherein
    the sealing member comprising a fluorinated epoxy sealing material comprising a fluorinated epoxy resin; and the fluorinated epoxy resin is selected from the group consisting of a fluorinated aromatic epoxy resin, a fluorinated alicyclic epoxy resin, and combinations thereof; and
    the fluorinated epoxy sealing material further comprises a copolymer of the fluorinated epoxy resin and a resin selected from the group consisting of a (meth)acryl-based resin, polyisoprene, a vinyl-based resin, a urethane-based resin, a cellulose-based resin, a perylene-based resin, and combinations thereof.

2. The OLED device of claim 1, wherein the sealing member further comprises a first primer layer interposed between the fluorinated epoxy sealing material and the base substrate.

3. The OLED device of claim 1, wherein the sealing member is formed through a thin film-type encapsulation method where a front surface of the organic light emitting diode is coated with the fluorinated epoxy sealing material, and the sealing member further comprising an inorganic layer formed on the fluorinated epoxy sealing material.

4. The OLED device of claim 3, wherein the inorganic layer comprises an inorganic material of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), and combinations thereof.

* * * * *